United States Patent [19]

Shimoto et al.

[11] Patent Number: 5,287,208
[45] Date of Patent: Feb. 15, 1994

[54] LIQUID CRYSTAL DEVICE WITH BENZOCYCLOBUTENE ALIGNMENT LAYER AND PROTECTIVE COATING FOR ELECTRODES

[75] Inventors: Tadanori Shimoto; Koji Matsui, both of Tokyo, Japan

[73] Assignee: NEC Corporation, Tokyo, Japan

[21] Appl. No.: 839,904

[22] Filed: Feb. 21, 1992

[30] Foreign Application Priority Data

Feb. 22, 1991 [JP] Japan ................... 3-050704

[51] Int. Cl.$^5$ .......................................... G02F 1/1337
[52] U.S. Cl. ........................................ 359/75; 359/76
[58] Field of Search .................. 359/74, 75, 76, 77, 359/78, 87, 88, 62

[56] References Cited

U.S. PATENT DOCUMENTS

| 4,273,420 | 6/1981 | Watanabe et al. | 359/76 X |
| 4,724,260 | 2/1988 | Kirchhoff et al. | 546/112 |
| 4,812,588 | 3/1989 | Schrock | 556/453 |
| 4,820,026 | 4/1989 | Okada et al. | 359/76 X |

FOREIGN PATENT DOCUMENTS

| 0070527 | 6/1981 | Japan | 359/78 |
| 0111833 | 9/1981 | Japan | 359/78 |
| 0160924 | 9/1983 | Japan | 359/74 |
| 0003120 | 1/1986 | Japan | 359/74 |
| 63-55526 | 3/1988 | Japan | |

OTHER PUBLICATIONS

Research Disclosure 268008A Aug. 10, 1986 "Electronics Uses of Benzocyclobutene".
IEEE Transactions on Components, Hybrids and Manufacturing Technology, vol. 13 No. 2, pp. 347-352, "Benzocyclobutene Interlayer Dielectrics for Thin Film Multichip Modules".

*Primary Examiner*—William L. Sikes
*Assistant Examiner*—Kenneth Parker

[57] ABSTRACT

To improve yield in the liquid crystal display device manufacturing process, at least either of an interconnection protective film for protecting the conductive interconnection formed on the substrate to electrically connect the transparent electrode film in the liquid crystal cells to the liquid crystal cell driving semiconductor chip and a liquid crystal molecule aligning film formed within the liquid crystal cells are made of benzocyclobutene resin. The benzocyclobutene resin is polyorganosiloxane crosslinked bisbenzocyclobutene.

4 Claims, 1 Drawing Sheet

LIQUID CRYSTAL DEVICE WITH BENZOCYCLOBUTENE ALIGNMENT LAYER AND PROTECTIVE COATING FOR ELECTRODES

BACKGROUND OF THE INVENTION

Field of the Invention

The present invention relates to a liquid crystal display device, and more particularly, to an active matrix drive type color liquid crystal display device which employs a thin film transistor as a switching element for each pixel.

Description of the Related Art

Active matrix drive type color liquid crystal devices which employ a thin-film transistor as a switching element for each pixel have been in wide use.

In the aforementioned type of conventional liquid crystal display device, polyimide resin film is used to form a conductive interconnection protective film for protecting metal interconnection provided on a substrate to electrically connect transparent electrodes of liquid crystal cells to a liquid crystal cell driving semiconductor chip as well as a liquid molecule aligning film formed in the liquid crystal cells.

Referring to, for example, Japanese unexamined publication No. 63-55526, to manufacture the conventional liquid crystal device, a transparent electrode film 24 is first formed in a matrix on the opposing surfaces of upper and lower substrates 22 and 23 made of glass, as shown in FIG. 1. Next, conductive interconnection 28 for electrically connect the liquid crystal driving semiconductor chip to the transparent electrode film 24 is formed by depositing, as a multilevel metal thin film, a NiCr film exhibiting an excellent adhesion to glass, a Cu film which wets the solder and then a Cr film which prevents oxidation of Cu and wetting of solder on the lower substrate 23 and then by selectively etching the formed multilevel metal thin film.

Thereafter, a polyimide resin film 25 is formed by coating polyimide resin on the opposed surfaces of the upper and lower substrates 22 and 23 in such a manner that it covers the transparent electrode film 24 and then by patterning the coated polyimide resin film.

A sealing material 27 is formed along the periphery of the transparent electrode film 24 except for an inlet (not shown) of a liquid crystal 26, the liquid crystal is injected into liquid crystal cells from the inlet and then the inlet is sealed by an adhesive.

In the aforementioned conventional liquid crystal display device, polyimide resin film is used as the liquid crystal molecule aligning film and the conductive interconnection protective film. However, hardening of the polyimide resin is done at a high temperature of about 350° C. Therefore, when polyimide resin is used to manufacture the active matrix drive type color liquid crystal display device which employs a thin-film transistor as a switching element of each pixel, heating of polyimide resin may deteriorate the function of the devices, such as transistors or capacitors.

Furthermore, hardening of polyimide resin generates water resulting from condensation, and the hardened film has a poor moisture resistance. These may cause corrosion of the transparent electrode film and conductive interconnection and hence deterioration of insulation.

Furthermore, the hardened film does not transmit well light having the wavelengths of 450 nm or below, and thus precludes formation of sharp image.

SUMMARY OF THE INVENTION

An object of the present invention is to provide a reliable liquid crystal display device which can basically overcome the aforementioned problems of the conventional liquid crystal display device, i.e., which can eliminate deterioration of the function due to heat and exhibits excellent moisture resistance and insulation.

To achieve the above object, the present invention provides a liquid crystal display device including conductive interconnection and an interconnection protective film.

The conductive interconnection is provided on a substrate for electrically connect the transparent electrode film in the liquid crystal cells to the liquid crystal cell driving semiconductor chip.

The interconnection protective film for protecting the conductive interconnection is made of benzocyclobutene resin.

The present invention further provides a liquid crystal display device having liquid crystal cells.

A liquid crystal molecule aligning film formed within the liquid crystal cells is made of benzocyclobutene resin.

Hardening of benzocyclobutene resin can be done at a thermal history of about 210° C. and 30 minutes. Therefore, when benzocyclobutene resin is applied to formation of the interconnection protective film and liquid crystal molecule aligning film, hardening thereof does not deteriorate the function of the device. Furthermore, hardening of benzocyclobutene resin does not generate water and the hardened benzocyclobutene resin film exhibits excellent moisture resistance. Consequently, corrosion of the transparent electrode film and conductive interconnection and deterioration of insulation can be eliminated, and yield in the manufacturing process can thus be improved while the reliability of the products can be increased.

Furthermore, the liquid crystal molecule aligning film made of benzocyclobutene resin does not absorb visible light and transmits visible light excellently, and thus assures formation of sharp images.

DETAILED DESCRIPTION OF THE PREFERRED EMBODIMENT

An embodiment of the present invention will now be described with reference to FIG. 2.

Figure 1:
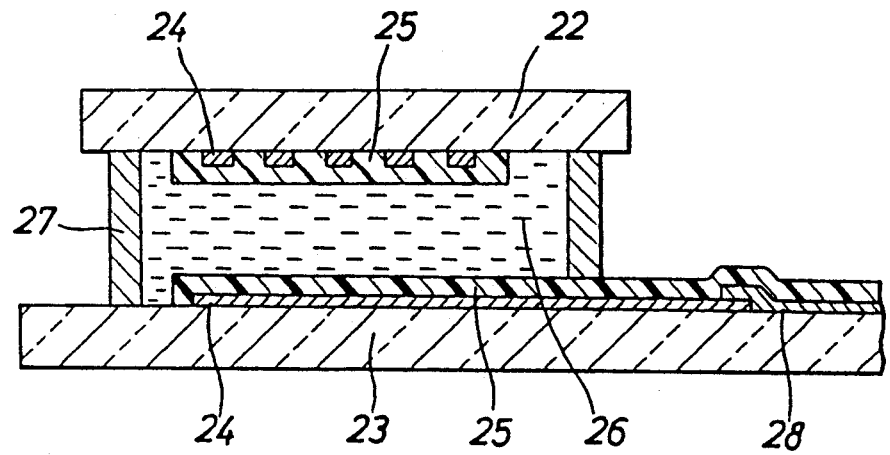
FIG. 1 is a cross-sectional view of an example of a conventional liquid crystal display device.
Figure 2:
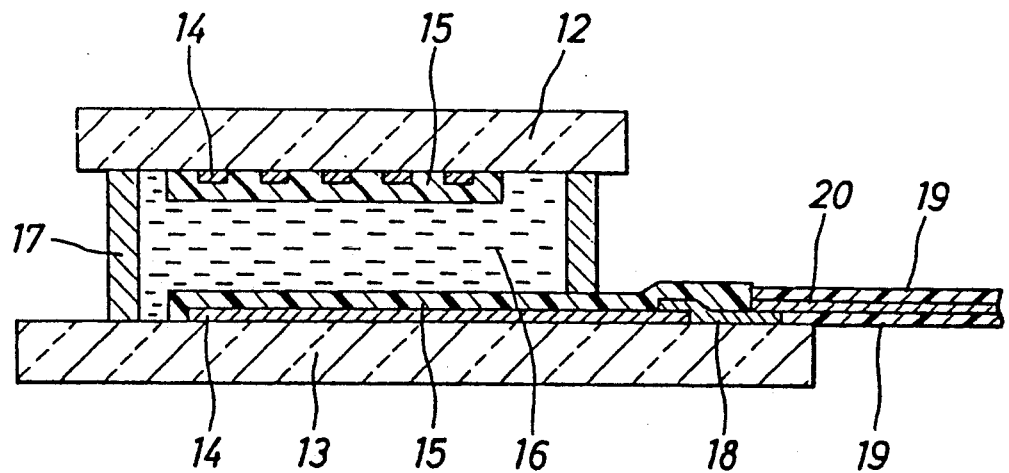
FIG. 2 is a cross-sectional view of an embodiment of a liquid crystal display device according to the present invention.

As shown in FIG. 2, a transparent electrode film 14 is formed in a display pattern on the opposed surfaces of upper and lower substrates 12 and 13 made of glass. Next, a multilevel metal thin film is formed by depositing, on the lower substrate 13, a NiCr film exhibiting an excellent adhesion to glass, a Cu film which wets the solder and then a Cr film which prevents oxidation of Cu and wetting of solder on the lower substrate 23. In a subsequent process, the formed multilevel metal thin film is subjected to etching in an interconnection pattern which electrically connects the transparent electrode film 14 to a position to which a flexible substrate 19 with an LSI chip mounted thereon is connected to provide conductive interconnection 18.

Thereafter, a benzocyclobutene film 15 (an interconnection protective film) is formed by coating benzocyclobutene resin on the opposed surfaces of the upper and lower substrates 12 and 13 in such a manner that it covers the transparent electrode film 14 and then by removing the film located at the position where the flexible substrate 19 is electrically connected to the conductive interconnection 18. Reference numeral 20 denotes conductive interconnection.

Subsequently, a sealing material 17 is formed along the periphery of the transparent electrode film 14 except for an inlet (not shown) of a liquid crystal 16, the liquid crystal 16 is injected into liquid crystal cells from the inlet and then the inlet is sealed by an adhesive, by which a liquid crystal display device is formed. The liquid crystal molecule aligning film formed within the liquid crystal cells is formed of benzocyclobutene resin.

Polyorganosiloxane crosslinked bisbenzocyclobutene monomer (disclosed in Japanese Patent Laid-Open No. hei 1-7491) or a compound in which arylcyclobutene is present and a polymer compound which can be manufactured from the compound in which arylcyclobutene is present (disclosed in Japanese Patent Laid-Open No. sho 63-501157) can be used as benzocyclobutene resin.

As will be understood from the foregoing description, in the liquid crystal display device according to the present invention, the interconnection protective film for protecting the conductive interconnection formed on the substrate to electrically connect the transparent electrode film of the liquid crystal cells to the liquid crystal cell driving semiconductor chip and the liquid crystal molecule aligning film formed within the liquid crystal cells are made of benzocyclobutene resin. Consequently, deterioration of the function of the device, which would be caused by heating during hardening, corrosion of the conductive interconnection and deterioration of insulation can be eliminated, and yield in the manufacturing process can thus be improved while the reliability of the products can be increased. Furthermore, the hardened film transmits visible light excellently, and thus assures formation of sharp images.

What is claimed is:

1. A liquid crystal display device based on liquid crystal cells having a pair of substrates separated by a sealed-in liquid crystal material and having on each of the opposed surfaces of the substrates a transparent electrode film; conductive interconnection for transmitting a liquid crystal cell driving signal to said transparent electrode film in said liquid crystal cells; and an alignment layer for aligning said liquid crystal material, said alignment layer being made of benzocyclobutene resin, wherein the benzocyclobutene resin comprises polyorganosiloxane crosslinked bisbenzocyclobutene monomer.

2. A liquid crystal display device according to claim 1, wherein said conductive interconnection is connected between said transparent electrode film and a liquid crystal cell driving semiconductor chip mounted on a flexible substrate.

3. A liquid crystal display device according to claim 1, and further comprising an interconnection protective film for protecting said conductive interconnection and being made of benzocyclobutene resin.

4. A liquid crystal display device according to claim 3, wherein the benzocyclobutene resin of said interconnection protective film comprises polyorganosiloxane crosslinked bisbenzocyclobutene monomer.

* * * * *